United States Patent
Isham

(10) Patent No.: US 7,936,540 B2
(45) Date of Patent: May 3, 2011

(54) DC-DC CONVERTERS HAVING IMPROVED CURRENT SENSING AND RELATED METHODS

(75) Inventor: Robert H. Isham, Flemington, NJ (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/869,960

(22) Filed: Aug. 27, 2010

(65) Prior Publication Data
US 2010/0320976 A1    Dec. 23, 2010

Related U.S. Application Data

(63) Continuation of application No. 12/409,239, filed on Mar. 23, 2009, now Pat. No. 7,796,365, which is a continuation of application No. 11/528,256, filed on Sep. 27, 2006, now abandoned.

(60) Provisional application No. 60/808,197, filed on May 24, 2006.

(51) Int. Cl.
*H02H 9/08* (2006.01)
(52) U.S. Cl. .......................................... 361/18; 361/93.9
(58) Field of Classification Search .................. 361/18, 361/93.9, 111; 323/248, 285; 324/76.11, 324/123 R
See application file for complete search history.

(56) References Cited

U.S. PATENT DOCUMENTS

| | | | |
|---|---|---|---|
| 5,994,885 A | 11/1999 | Wilcox et al. | |
| 6,292,378 B1 * | 9/2001 | Brooks et al. | 363/65 |
| 6,377,034 B1 | 4/2002 | Ivanov | |
| 6,621,256 B2 | 9/2003 | Muratov et al. | |
| 6,687,105 B2 | 2/2004 | Duduman et al. | |
| 6,703,893 B1 | 3/2004 | Isham | |
| 6,906,536 B2 | 6/2005 | Pearce et al. | |
| 7,015,680 B2 | 3/2006 | Moraveji | |
| 7,714,561 B2 | 5/2010 | Ge | |

* cited by examiner

*Primary Examiner* — Danny Nguyen
(74) *Attorney, Agent, or Firm* — Fogg & Powers LLC

(57) ABSTRACT

A DC-DC converter includes a chip including an error amplifier, a pulse width modulator (PWM), and an inductor driven by said PWM in series with an output node ($V_{OUT}$), wherein a load current flows through the inductor. A circuit for sensing the load current includes a first operational amplifier and a sense resistor having resistance $R_{SENSE}$; wherein a sense current related to the load current flows through the sense resistor. A reference resistor has a resistance $R_{REFERENCE}$ which is a fixed multiple of $R_{SENSE}$. A set resistor has a resistance $R_{SET}$. Tracking circuitry sets a voltage across the reference resistor to be equal to a voltage across the set resistor. A function block receives a current through the set resistor and a current through the reference resistor to find their ratio. A current multiplier provides a measurement current which is proportional to the load current divided by $R_{SET}$.

19 Claims, 4 Drawing Sheets

DC-DC CONVERTERS HAVING IMPROVED CURRENT SENSING AND RELATED METHODS

CROSS-REFERENCE TO RELATED APPLICATIONS

This application is a continuation application of U.S. Non-Provisional application Ser. No. 12/409,239 (the '239 application) filed on Mar. 23, 2009 (pending), which is a continuation application of U.S. Non-Provisional application Ser. No. 11/528,256 (the '256 application) filed on Sep. 27, 2006 (abandoned). This application also claims the benefit of U.S. Provisional Application No. 60/808,197 (the '197 Application) filed on May 24, 2006. The '239 application, '256 application, and the '197 Application are incorporated by reference in their entirety in the present application.

FIELD OF THE INVENTION

The invention relates to the precise measurement of inductor current, especially for controlling switching in voltage regulator circuits and related power circuits.

BACKGROUND OF THE INVENTION

It is necessary to accurately measure load current in order to accomplish control of a variety of devices including electric current motors, DC-DC converter circuits and voltage regulator circuits. A known circuit 100 for measuring load current via inductor current flow in a DC-DC converter is shown in FIG. 1(a). The portion of circuit 100 to the right of the vertical dashed line between pins $I_{SENSE-}$ and $I_{SENSE+}$ is typically internal to the IC chip, while the portion including the low pass filter comprising inductor L 110 and $C_{FILTER}$ (output capacitor) that is typically external to the IC chip is to the left of the dashed line between $I_{SENSE-}$ and $I_{SENSE+}$. External inductor L 110, with an inductance of L having DC resistance DCR, forms part of the low pass filter network with $C_{FILTER}$ that turns an applied pulse width modulated input signal, provided by a pulse width modulator (PWM; not shown) into a steady state voltage output, $V_{OUT}$, across a load $R_{LOAD}$. A portion of the voltage drop across L 110 is due to its DC resistance, shown as DCR. A resistor in series with a capacitor, $R_{IND}$ and $C_{IND}$, is shown placed across inductor 110, $R_{IND}/C_{IND}$ providing a time constant that closely matches the time constant of L/DCR.

The voltage across $C_{IND}$, shown in FIG. 1(a) as $V_{IND}$, matches the voltage drop across DCR, and is thus a good indication of inductor current, $I_{IND}$. An operational amplifier, A1, is placed in circuit 100 to drive the gate of an Nmos transistor, Q1, whose source connects back to the inverting input of A1 at pin $I_{SENSE+}$. A sense resistor, $I_{SENSE}$ 120, is placed between pin $I_{SENSE+}$ and $V_{OUT}$.

A1's non-inverting input, connected to pin $I_{SENSE-}$, is connected to the junction between $R_{IND}$ and $C_{IND}$. In this configuration the high gain of A1 drives the voltage at pin $I_{SENSE+}$ to essentially equal the voltage at pin $I_{SENSE-}$, so that the voltage across capacitor $C_{IND}$ equal to $V_{IND}$ will be placed across $R_{SENSE}$. Q1 will then carry a current equal to $V_{IND}/R_{SENSE}$, or $I_{IND}*DCR/R_{SENSE}$. This current, $I_{SENSE}$, is available at the Q1's Drain, $I_{OUT}$, and can then be processed and used for, among other things, over current trip or setting a regulated output impedance.

Although Q1 is shown in FIG. 1 as being an Nmos transistor, in an alternate embodiment it could also be a combination of Nmos and Pmos, with the drain currents combined to form bidirectional current sensing. It could also be only an Nmos or Pmos, with offset current added at $I_{SENSE+}$ and subtracted back out at $I_{OUT}$ to allow bidirectional current sensing.

The $R_{SENSE}$ resistor and $I_{SENSE-}$ pin can also be connected across a synchronous rectifier FET. In that case the $RDS_{ON}$ of the FET would be the current sensing element instead of the inductor DCR. Load current sensing by sampling the voltage across the lower MOSFET $r_{DS(ON)}$ when the PWM drives a synchronous rectifier is demonstrated in circuit 140 shown in FIG. 1(b). The PWM 150 drives a gate driver 152 which drives the upper and lower (synchronous rectifier) Nmos FET's 156 and 157, which in turn drive inductor 160. The amplifier A1 is ground-reference by connecting the ISEN− input to the source of the MOSFET 157. The inductor current $I_L$ flows from Vin through the FET 156 while FET 156 is on, and flows from ground while the lower FET 157 is on. The inductor current ($I_L$) therefore causes a voltage drop across FET 157 equal to the product of RDSon and the inductor current, which is related to the resistance of sense resistor 170 multiplied by the current sensed ($I_{SEN}$). Specifically, the resulting current into the ISEN+ pin is proportional to the channel current $I_L$. The ISEN current is then sampled and held after sufficient settling time as known in the art. The sampled current can be used for applications including channel-current balance, load-line regulation, and overcurrent protection.

$R_{SENSE}$ in Circuits 100 and 140 is placed off-chip because $R_{SENSE}$ needs to be adjustable, such as to get the desired value of $I_{OUT}$ for circuit 100 for different combinations of DCR and $I_{IND}$. For instance, if $I_{OUT}$ is compared to a fixed value of current inside an integrated circuit (IC) to generate an over current trip, and the inductor DCR and desired $I_{IND}$ current trip point are set by system constraints, then the value of $R_{SENSE}$ must be adjusted to achieve the desired $I_{OUT}$ at the desired $I_{IND}$. For the reason of required adjustability, $R_{SENSE}$ is therefore generally placed external to the IC as shown in FIG. 1. A second reason that $R_{SENSE}$ is usually placed external to the IC is that most integrated circuit processes do not support an accurate and stable, internal resistor.

A problem with an external $R_{SENSE}$ is the susceptibility of the $I_{SENSE+}$ pin to noise pickup indicated in FIGS. 1(a) and 1(b) as noise coupling through parasitic capacitor 130. Referring again to FIG. 1(a), noise current that is capacitively coupled to pin $I_{SENSE+}$ appears as the drain current of Q1 including a noise component shown in FIG. 1 as $I_{OUT+Noise}$. Such noise coupling is known to adversely impact performance and has required very careful printed circuit board layouts to minimize the capacitive coupling at pin $I_{SENSE+}$. It is not generally feasible to try to bypass $I_{SENSE+}$, as this would put a pole in the feedback of amplifier A1, possibly making A1 unstable.

Thus, there is a need for an improved switching regulator circuit, and specifically for a current measurement circuit which can be used for precisely measuring load current in a switching regulator circuit, motor controller circuit, or the like, that does not require an external, precise $R_{SENSE}$ at the inverting input of A1 with its attendant noise susceptibility.

SUMMARY

A DC-DC converter includes a chip including an error amplifier and a pulse width modulator (PWM) having an input connected to an output of the error amplifier, and an inductor driven by said PWM in series with an output node ($V_{OUT}$) of the converter, wherein a load current flows through the inductor. $V_{OUT}$ is fed back through a network including a feedback resistor (RFB) to an inverting input of the error amplifier. A circuit for sensing the load current includes a first operational amplifier, a sense resistor on the chip having resistance $R_{SENSE}$ coupled to an inverting input of the first amplifier; wherein a sense current related to the load current flows through the sense resistor, a dependent current source provides an output current to supply the sense current. A reference resistor is disposed on the chip having a resistance $R_{REFERENCE}$ which is a fixed multiple of $R_{SENSE}$. A set resistor is provided having a resistance $R_{SET}$. Tracking circuitry sets a voltage across the reference resistor to be equal to a voltage across the set resistor. A function block is coupled to receive a current through the set resistor and a current through the reference resistor to find their ratio. A current multiplier is provided, wherein an output of the function block is coupled to the current multiplier. The current multiplier provides a measurement current which is proportional to the load current divided by $R_{SET}$.

The invention can utilize a variety of circuit arrangements for sensing load current. In one embodiment, inductor DCR sensing is utilized, wherein the converter further comprises a resistor in series with a capacitor placed across the inductor having a time constant designed to match a time constant of the inductor and its associated DC resistance (DCR). In another embodiment, MOSFET $r_{DS(ON)}$ sensing is utilized, wherein the converter further comprises a synchronous rectifier connected between an output of the PWM and the inductor.

The sense resistor and said reference resistor are preferably formed from the same material. In one embodiment the converter comprises a current mirror having an output connected the inverting input of the error amplifier and an input for sensing the measurement current, said current mirror converting said measurement current to a sourcing current to flowing through RFB to raise a potential of the inverting input of said error amplifier with increases in the measurement current to control output impedance. In another embodiment, the converter further comprises structure to compare the measurement current to a fixed reference current and generate and apply a reset signal to the PWM to protect the PWM from an over current condition. In this embodiment, the structure to compare can comprise an inverter, an output of the inverter coupled to a reset pin of the converter, wherein if the measurement current is greater than the reference current the PWM becomes disabled.

A method of current sensing in DC-DC converters comprises the steps of providing a DC-DC converter chip comprising an error amplifier coupled to a pulse width modulator (PWM) driving an inductor in series with an output node ($V_{OUT}$) of the converter adapted for referenced to ground through a load, wherein a load current flows through said inductor. $V_{OUT}$ is fed back through a network including a feedback resistor (RFB) to an inverting input of the error amplifier. A circuit for sensing the load current including a sense resistor is on the chip having a resistance ($R_{SENSE}$) for generating a sense current which is related to the load current. A dependent current source supplies an output current ($I_{OUT}$) to supply the sense current. A reference resistor is disposed on the chip having a resistance $R_{REFERENCE}$ which is a fixed multiple of $R_{SENSE}$. A set resistor having a resistance $R_{SET}$ is provided, tracking circuitry for setting a voltage across the reference resistor equal to a voltage across the set resistor is also provided.

A ratio of current through the set resistor and a current through the reference resistor is determined. A measurement current independent of an actual value of said $R_{SENSE}$ is then determined using the ratio, the measurement current being proportional to the load current divided by $R_{SET}$.

The circuit for sensing said load current can implement inductor DCR sensing. In another embodiment, the circuit for sensing said load current implements MOSFET $r_{DS(ON)}$ sensing.

The method can further comprise the step of utilizing the measurement current to provide a fixed output impedance. In this embodiment, the utilizing step can comprise converting the measurement current (which is generally a sink current) to a sourcing current, and flowing the sourcing current through the feedback resistor to increase a voltage at the inverting input with respect to $V_{OUT}$ as the inductor current increases.

In another embodiment of the invention the method further comprises the step of utilizing the measurement current to shut down the PWM if the load current increases beyond a predetermined amount to protect the PWM from an over current condition. In this embodiment the utilizing step can comprise comparing the measurement current to a predetermined reference current, and disabling power to said PWM if the measurement current is greater than the reference current. In one embodiment, the measurement current and reference current are both provided as inputs to an inverter with the inverter output coupled to a reset pin of the regulator, wherein if the measurement current is greater than the reference current the PWM is disabled.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION

Figure 1A:
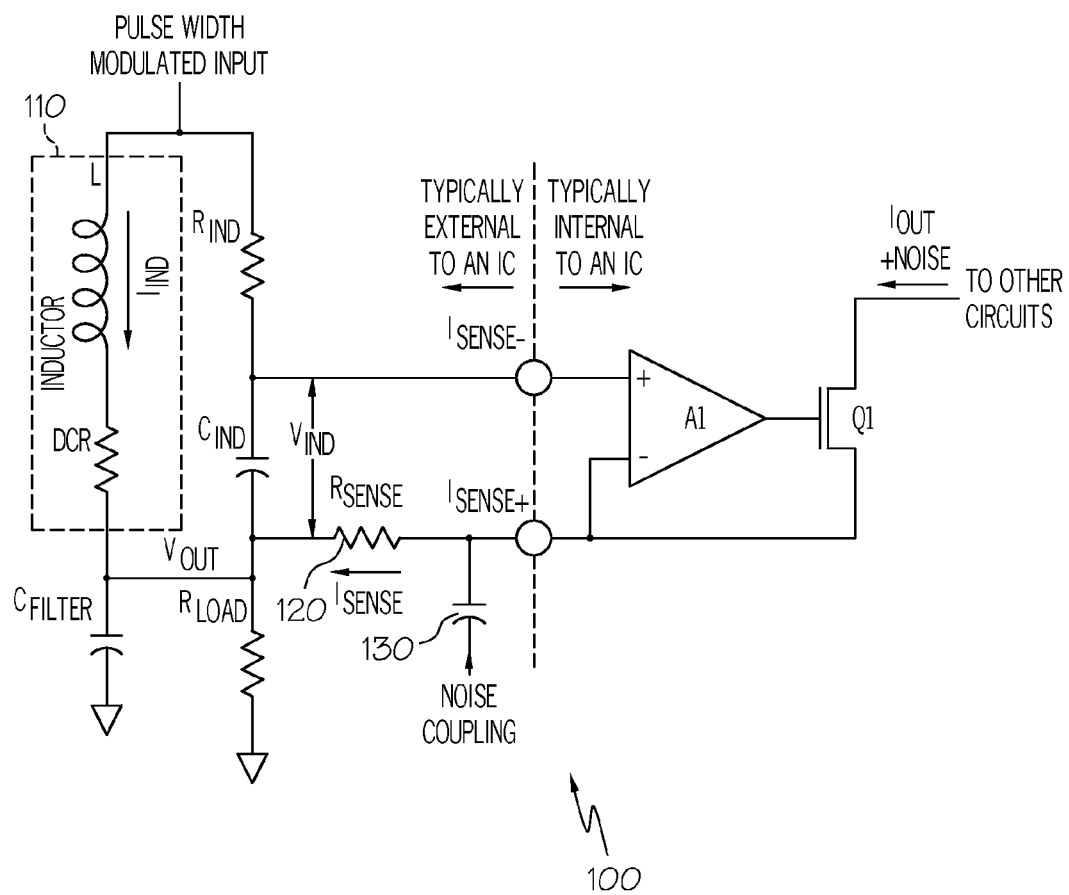
FIG. 1(a) is a schematic for a known load current sensing in a DC-DC converter implementing inductor DCR sensing.
Figure 1B:
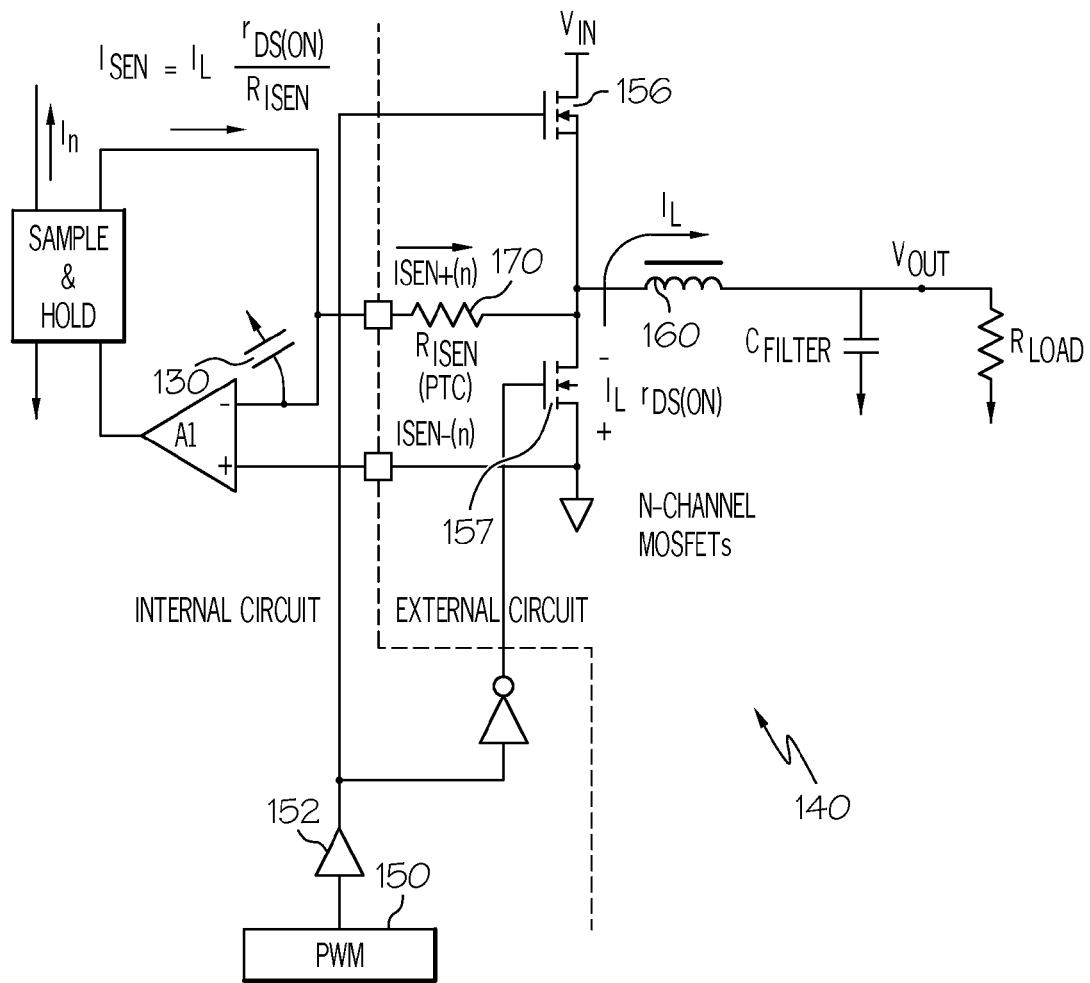
FIG. 1(b) is a schematic for a known circuit for load current sensing in a DC-DC converter implementing $r_{DS(ON)}$ sensing when the PWM drives a synchronous rectifier.
Figure 2:
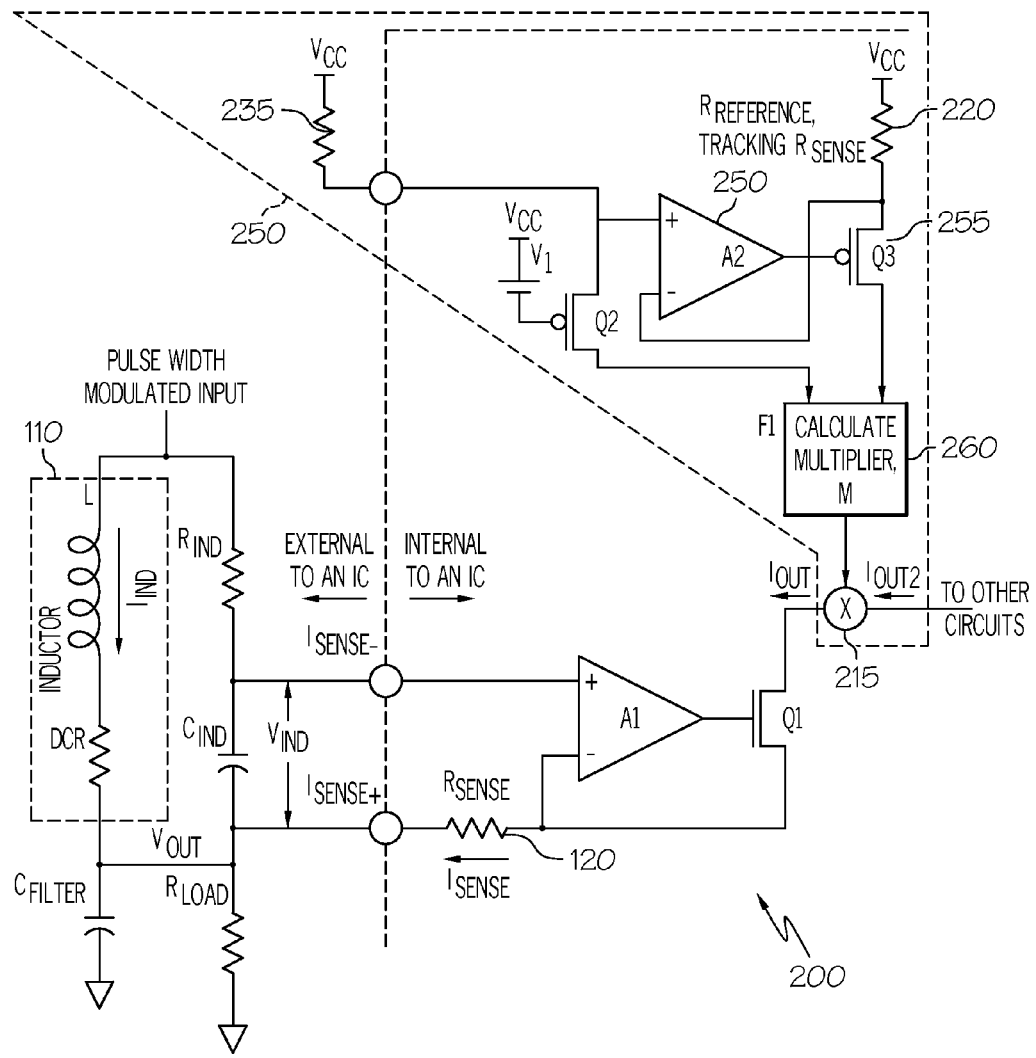
FIG. 2 shows a circuit according to an embodiment of the invention having an internal sense resistor for measuring the inductor current flow in a DC-DC converter.

A circuit according to an embodiment of the invention having an internal sense resistor for load current sensing in a DC-DC converter or other switching regulator circuit implementing inductor DCR sensing is shown in FIG. 2. Circuit 200 includes the same circuit elements shown in circuit 100 shown in FIG. 1(a), but adds additional circuitry 250 (shown within dashed lines) including reference and tracking circuitry that enables inductor current through inductor 110 to be measured independent of the actual value of $R_{SENSE}$ 120. As with circuit 100, circuit 200 includes a portion typically internal to the IC and a portion typically external to the IC (inductor L 110 and $C_{FILTER}$ are generally external to the IC). However, unlike circuit 100 shown in FIG. 1, $R_{SENSE}$ is internal to the IC.

Circuit 200 includes a current multiplier 215 in the path of $I_{OUT}$, to form an output current $I_{OUT2}$ which is a multiple of $I_{OUT}$, equal to $M*I_{OUT}$. Circuit 200 places a second resistor, $R_{REFERENCE}$ 220 inside the IC. $R_{REFERENCE}$ 220, by reason of placement in proximity to the location of $R_{SENSE}$ 120 on the chip and being of the same electrically conductive material as $R_{SENSE}$ 120, can be made to have a precisely controlled resistance ratio, K, to $R_{SENSE}$. That is, $R_{REFERENCE}=K*R_{SENSE}$. K can be made independent of process variation or temperature variation, and can be any convenient value, greater or less than one. Circuit 200 also includes an external resistor, $R_{SET}$ 235. The voltage on the high potential side of $R_{SET}$ 235 is shown coupled to $V_{CC}$ and the low potential side of $R_{SET}$ 235 is driven to an arbitrary reference voltage. As shown in FIG. 2, the arbitrary reference voltage on the low potential side of $R_{SET}$ 235 is set by an exemplary circuit comprising a voltage source V1 which is coupled to the gate of a Pmos source follower, Q2.

As known to those skilled in the art, source and drain electrodes of MOS transistors can interchange roles during operation of the transistor. Therefore, the terms "source" and "drain" as used herein and in the claims to identify the current-carrying electrode of an MOS transistor are not intended to limit the function performed by the current-carrying electrode with respect to whether it is functioning as a source or a drain at a particular time in the circuit operation.

Operational amplifier $A_2$ 250 together with Pmos Q3 255 are connected to drive the low potential end of $R_{REFERENCE}$ 220 so that $R_{REFERENCE}$ 220 has essentially the same voltage across it as does $R_{SET}$ 235. $R_{REFERENCE}$ 220 could be driven by other circuitry, such as an NPN/PNP mixed follower, but system accuracy requirements might preclude such methods in certain applications. The current from $R_{REFERENCE}$ 220 and the current from $R_{SET}$ 235 are fed to function block $F_1$ 260. F1, through well known analog or digital circuitry, can develop a multiplier factor, M, which is equal to the ratio of current through $R_{SET}$ to current through $R_{REFERENCE}$. Since the currents through resistors that have equal potentials across them are proportional to the inverse of the respective resistor values, then M is equal to $R_{REFERENCE}/R_{SET}$. Since $R_{REFERENCE}$ equals $K*R_{SENSE}$, then $M=K*R_{SENSE}/R_{SET}$.

As noted above relative to circuit 100 shown in FIG. 1, the output current $I_{OUT}$ is equal to $I_{IND}*DCR/R_{SENSE}$. $I_{OUT2}=M*I_{OUT}=M*I_{IND}*DCR/R_{SENSE}$. Substituting $K*R_{SENSE}/R_{SET}$ for M, then:

$$I_{OUT2}=K*I_{IND}*DCR/R_{SET} \quad (1)$$

Significantly, in equation (1) there is no $R_{SENSE}$ term, and $I_{OUT2}$ is only dependent on the value of external circuit elements (L and $R_{SET}$, and the DC resistance of L (DCR)). Therefore, there is no requirement for $R_{SENSE}$ to be accurate. $R_{SENSE}$ 120 only needs to be a fixed ratio (K) relative to $R_{REFERENCE}$ 220, the fixed ratio conveniently being provided by the circuit design. Process (or temperature) variation in the resistivity of the electrically conductive material used for $R_{SENSE}$ and $R_{REFERENCE}$ thus do not affect the accuracy of the current measurement provided by circuit 200 because of the resistor ratioing.

Pmos followers (Q2 and Q3) are shown driving both $R_{SET}$ 235 and $R_{REFERENCE}$ 220, and $R_{SET}$ and $R_{REFERENCE}$ are shown terminated at the positive supply, VCC. Although shown as Pmos followers, the drivers could alternatively be NMOS or bipolar transistors of either polarity, and the termination could be ground or another supply. If embodied as NMOS driver transistors, the voltage reference V1 driving the gate of Q2 would switch polarity and termination appropriately.

Although not shown in FIG. 2, $R_{REFERENCE}$ 220 could be driven by the reference voltage V1 and follower Q2, and $R_{SET}$ can be actively driven by A2 and Q3. This is generally less desirable, because parasitic capacitance at $R_{SET}$ places a pole in the feedback of A2 250 which can cause instability for A2.

Circuit 200 can be used to provide improved switching regulator circuits which benefit from precisely measured inductor current, such as DC-DC converters, motor controller circuits, and the like.

Figure 3:
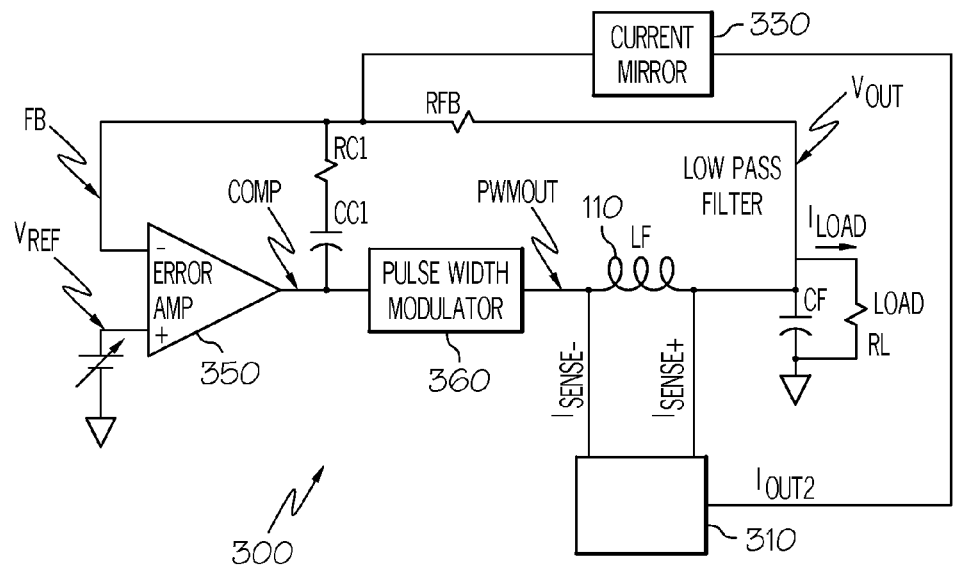
FIG. 3 shows the schematic of an exemplary DC-DC converter that includes a circuit for measuring load current flow using inductor DCR sensing according to another embodiment of the invention used to control the output impedance of the converter.
Figure 4:
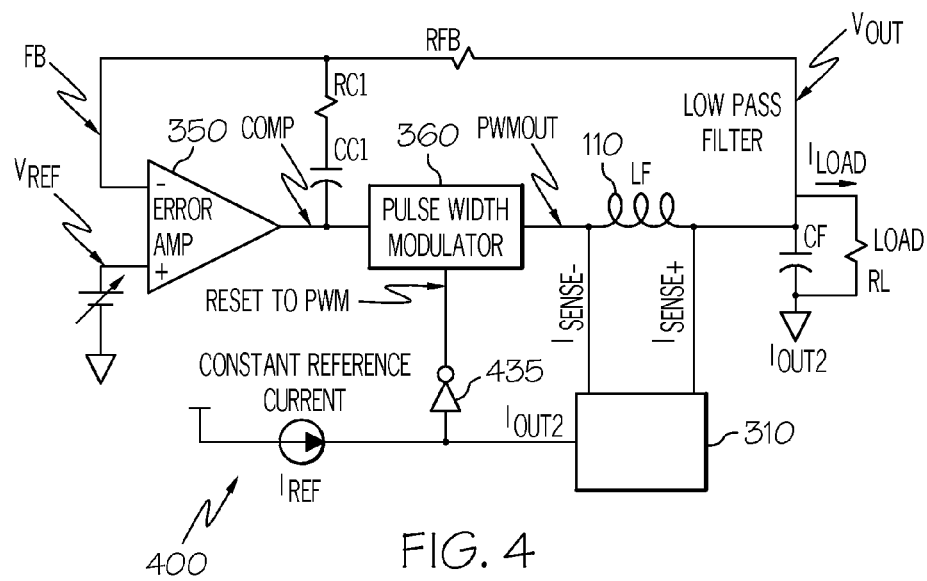
FIG. 4 shows the schematic of an exemplary DC-DC converter that includes a circuit for measuring load current flow again using inductor DCR sensing according to yet another embodiment of the invention used to protect the PWM supply of the converter with an over current trip action.

FIGS. 3 and 4 show exemplary uses of the sensed current $I_{OUT2}$ with respect to a pulse width modulated DC-DC converter. FIG. 3 demonstrates controlling output impedance of the converter, while FIG. 4 shows protecting the PWM supply with an over current trip action. However, it is noted that the present invention is not limited to pulse width modulated DC-DC converters, as it applies to other related devices. Moreover, as noted above, load current sensing circuits other than inductor DCR sensing-based circuits can be used with the invention. For example, the arrangement shown in FIG. 1(b) implementing MOSFET $r_{DS(ON)}$ current sensing can instead be used where the sensing connections ($ISENSE^-$ and $ISENSE^+$) are connected to the source of the lower FET (which is grounded) and its drain. Other suitable load current sensing circuitry can also be used for the invention.

Referring now to FIG. 3, the schematic of an exemplary PWM DC-DC converter 300 is shown that includes a circuit for measuring inductor current flow according to the invention 310, across pins $I_{SENSE-}$ and $I_{SENSE+}$ of inductor 110 that together with capacitor CF forms a low pass filter for the load RL. Converter 300 includes an error amplifier 350, which compares an applied reference voltage, $V_{REF}$, to the regulated output voltage, $V_{OUT}$. $V_{OUT}$ is fed back to the inverting input of amplifier 350, node FB, through resistor RFB. There are other compensation components, RC1 and CC1 coupled between the output node of error amplifier 350, COMP, and node FB in order to provide a proper system response. Node COMP drives a pulse width modulator, PWM 360 which provides some relationship between its COMP voltage input and the duty cycle output. An ordinary oscillator which provides a clock signal (e.g. sawtooth) to an input of the PWM 360 is not shown. The PWM output signal $PWM_{OUT}$ is low pass filtered by inductor LF 110 and capacitor CF to become output voltage, $V_{OUT}$. A typical requirement of a DC-DC converter is that the regulator have a specified output impedance. That is, $V_{OUT}$ must decrease at a fixed rate with respect to increasing load current, $I_{LOAD}$, to provide a fixed specified output impedance.

Circuit for measuring inductor current flow 310 is used in converter 300 shown in FIG. 3 to sense the current through LF 110, which as noted above is essentially the same current, on average, as the current through the load RL. Circuit for measuring current 310 can be embodied as circuit 200 comprising $R_{IND}$ and $C_{IND}$ across LF 110, together with on chip $R_{SENSE}$ between $V_{OUT}$ and the $I_{SENSE+}$ pin, and the other exemplary circuitry shown attached to the right of pins $I_{SENSE-}$ and $I_{SENSE+}$ together with $R_{SET}$ shown in circuit 200.

The current $I_{OUT2}$ generated by circuit for measuring inductor current 310 is applied, with the proper polarity using current mirror 330. The output of current mirror 330 is a sourcing current representation of $I_{OUT2}$, which flows through RFB, thus increasing the voltage at node FB with respect to $V_{OUT}$ as ILOAD increases. Error amplifier 350 then brings the voltage at $V_{OUT}$ down so that node FB remains equal to $V_{REF}$, thus providing the desired fixed output impedance.

FIG. 4 shows a second exemplary application for inductor current sensing circuits according to the invention. FIG. 4 shows the schematic of an exemplary PWM DC-DC converter 400 that includes a circuit for measuring inductor current flow according to the invention 310 used to protect the PWM supply with an over current trip action. As mentioned relative to FIG. 3, circuit for measuring current 310 can be embodied as the exemplary measurement circuitry shown in FIG. 2.

In operation, circuit for measuring inductor current flow according to the invention 310 disables power to PWM 360 if the load current ILOAD increases beyond a predetermined current level. In one embodiment, inverter 435 is coupled to a reset pin of PWM 360. $I_{OUT2}$ is compared to a fixed reference current provided, $I_{REF}$. For converters which require the reset pin to be high for normal operation, if $I_{OUT2}$ is greater than $I_{REF}$, the input of inverter 435 is pulled down, which results in the inverter going high and sending a reset signal to the PWM 360 which disables PWM 360 and thus protects PWM 360 from an over current condition There are several significant advantages provided by the invention. One advantage is that $R_{SENSE}$ is on chip resulting in the inverting input to A1 being an internal node, and therefore shielded from capacitive coupling of noise. Both $I_{SENSE+}$ and $I_{SENSE-}$ nodes in circuit 200 are low impedance, so are less susceptible to noise pickup. Another advantage is that the input from $R_{SET}$, an external resistor, can be DC or a low frequency since it does not affect the bandwidth of the path from $I_{SENSE}$ to $I_{OUT2}$. $R_{SET}$ can therefore be bypassed (bypass capacitor not shown) to prevent noise pickup.

A further advantage is $R_{SET}$ can be used to control several channels of $I_{SENSE}$ to $I_{OUT2}$. This saves components compared to using a separate external $R_{SENSE}$ for every channel. Another advantage is that a thermistor could be used to modify the value of $R_{SET}$ with temperature, adjusting the gain of $I_{OUT2}$ to match the thermal coefficient of the inductor DCR. A positive temperature coefficient thermistor (PTC) or a PTC-resistor network could be used to replace $R_{SET}$. The PTC or PTC-resistor network could be chosen to have the same temperature coefficient as that of the DCR of the inductor, and would be placed to thermally track the inductor. As the inductor increased in temperature and therefore its DCR value, a like increase in resistance of the PTC or PTC-resistor network would decrease the multiplying gain of the sensing circuit, giving a constant ratio of sensed current to actual inductor current. The thermistor could be bypassed near the IC to prevent noise pickup.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

What is claimed is:

1. A power converter having a plurality of channels, the power converter comprising:
   a set resistor having a resistance $R_{set}$; and
   for each of the plurality of channels:
      an error amplifier configured to compare a reference voltage to a regulated output voltage;
      a pulse width modulator coupled to the error amplifier and configured to modify the regulated output voltage based on the comparison in the error amplifier; and
      a current sensing element coupled to the pulse width modulator and configured to sense a first current;
      a sense resistor having a resistance $R_{sense}$, the sense resistor coupled to the current sensing element such that the first sensed current flows through the sense resistor;
      a reference resistor having a resistance $R_{reference}$ which is a fixed multiple of $R_{sense}$; and
      circuitry coupled to the set resistor, the reference resistor and the sense resistor, the circuitry configured to produce an output current having a value that is proportional to $R_{set}$ and a fixed ratio between $R_{sense}$ and $R_{reference}$, wherein the circuitry is coupled to the error amplifier to provide the output current to the error amplifier.

2. The power converter of claim 1, wherein the current sensing element for each respective channel implements inductor direct current resistance (DCR) sensing.

3. The power converter of claim 1, wherein, for each of the plurality of channels, the circuitry includes tracking circuitry configured to drive the reference resistor such that the voltage across the reference resistor is substantially equal to the voltage across the set resistor.

4. The power converter of claim 3, wherein, for each of the plurality of channels, the circuitry is configured to determine a ratio of current through $R_{set}$ to current through $R_{reference}$ and to combine the ratio of current through $R_{set}$ to current through $R_{reference}$ with a first measurement current to produce the output current.

5. The power converter of claim 3, wherein the tracking circuitry comprises:
   a source follower coupled to a low potential side of the reference resistor; and
   an operational amplifier having an output coupled to a gate of the source follower.

6. The power converter of claim 1, wherein the set resistor comprises a plurality of resistors including one or more thermistors.

7. The power converter of claim 1, wherein the reference resistor and the sense resistor are comprised of the same type of material.

8. The power converter of claim 1, further comprising an inverter coupled to a reset pin of the pulse width modulator, wherein if the output current is greater than a reference current the inverter sends a reset signal to the pulse width modulator.

9. The power converter of claim 1, further comprising, for each of the plurality of channels, a current mirror coupled between the output of the integrated circuit and an input of the error amplifier, wherein the current mirror increases the voltage at the input of the error amplifier based on the output current such that the power converter provides a fixed output impedance.

10. A device for measuring a load current in each of a plurality of channels, the device comprising:
   a set resistor having a resistance $R_{set}$; and
   an integrated circuit coupled to the set resistor; wherein, for each of the plurality of channels, the integrated circuit comprises:
      a sense resistor having a resistance $R_{sense}$, the sense resistor coupled to a respective current sense element such that a respective first sensed current from the current sense element flows through the sense resistor;
      a reference resistor having a resistance $R_{reference}$ which is a fixed multiple of $R_{sense}$; and
      circuitry coupled to the set resistor, the reference resistor and the sense resistor, the circuitry configured to produce an output current having a value that is proportional to $R_{set}$ and a fixed ratio between $R_{sense}$ and $R_{reference}$.

11. The device of claim 10, wherein, for each of the plurality of channels, the sense resistor is coupled to a current sensing element that implements inductor direct current resistance (DCR) sensing.

12. The device of claim 10, wherein, for each of the plurality of channels, the circuitry in the integrated circuit includes tracking circuitry configured to drive the reference resistor such that the voltage across the reference resistor is substantially equal to the voltage across the set resistor.

13. The device of claim 12, wherein the tracking circuitry comprises:
   a source follower coupled to a low potential side of the reference resistor; and
   an operational amplifier having an output coupled to a gate of the source follower.

14. The device of claim 12, wherein, for each of the plurality of channels, the circuitry in the integrated circuit is configured to determine a ratio of current through $R_{set}$ to current through $R_{reference}$ and to combine the ratio of current through $R_{set}$ to current through $R_{reference}$ with a first measurement current to produce the output current.

15. The device of claim 10, wherein the set resistor comprises a plurality of resistors including one or more thermistors.

16. The device of claim 10, wherein the reference resistor and the sense resistor are comprised of the same type of material.

17. The device of claim 10, wherein, for each of the plurality of channels, the sense resistor is coupled to a current sensing element that implements Metal Oxide Semiconductor Field-Effect Transistor (MOSFET) RDS(on) sensing.

18. A method of measuring a load current for each of a plurality of channels, the method comprising for each of the plurality of channels:
   receiving a respective sensed current;
   passing the received sensed current through a respective first resistor having a first resistance;
   generating a respective first measurement current indicative of the load current from the respective sensed current based on the first resistance;
   setting a voltage across a respective second resistor substantially equal to a voltage across a third resistor, the third resistor having a third resistance, wherein the same third resistor is used for each of the plurality of channels;
   determining a ratio of current through the respective second resistor and current through the third resistor, wherein each respective second resistor has a second resistance that is a fixed multiple of the respective first resistance;
   combining the respective first measurement current with the determined ratio to generate a respective second measurement current indicative of the load current, the respective second measurement current being independent of the respective first resistance; and
   outputting the respective second measurement current.

19. The method of claim 18 further comprising modifying the respective second resistance to adjust a gain of the respective second measurement current.

* * * * *